United States Patent
Fang et al.

(10) Patent No.: US 8,604,487 B2
(45) Date of Patent: Dec. 10, 2013

(54) NITRIDE SEMICONDUCTOR SUBSTRATE AND METHOD FOR MANUFACTURING THE SAME

(75) Inventors: Yen-Hsiang Fang, Taipei County (TW); Chu-Li Chao, Hsinchu (TW); Chih-Wei Hu, Taoyuan County (TW); Yih-Der Guo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/329,336

(22) Filed: Dec. 19, 2011

(65) Prior Publication Data

US 2012/0161148 A1    Jun. 28, 2012

(30) Foreign Application Priority Data

Dec. 27, 2010 (TW) .................. 99146145 A

(51) Int. Cl.
*H01L 29/15* (2006.01)
(52) U.S. Cl.
USPC .............. 257/76; 257/13; 257/98; 257/99
(58) Field of Classification Search
USPC ................................ 257/79, 615
See application file for complete search history.

(56) References Cited

U.S. PATENT DOCUMENTS

| | | | |
|---|---|---|---|
| 7,187,014 B2 | 3/2007 | Hirose et al. | |
| 2007/0096130 A1 | 5/2007 | Schiaffino et al. | |
| 2007/0284567 A1* | 12/2007 | Pokrovskiy et al. | 257/13 |
| 2009/0079035 A1 | 3/2009 | Wang | |
| 2009/0243043 A1 | 10/2009 | Wang | |
| 2010/0090312 A1* | 4/2010 | Guo et al. | 257/615 |

FOREIGN PATENT DOCUMENTS

| | | |
|---|---|---|
| CN | 101373714 | 2/2009 |
| CN | 101510504 | 8/2009 |
| CN | 101651092 | 2/2010 |
| JP | 2009-140976 | * 6/2009 |
| JP | 2009-242236 | * 10/2009 |
| TW | 200947518 | 11/2009 |
| TW | 201036035 | 10/2010 |

OTHER PUBLICATIONS

Sumitomo Electric Ind Ltd, JP 2009-242236 Machine Translation, Feb. 25, 2012.*
Panasonic Electric Works Co Ltd, JP 2009-140976 Machine Translation, Feb. 25, 2012.*
"Office Action of Taiwan Counterpart Application", issued on May 30, 2013, p. 1-p. 7.
"Office Action of China Counterpart Application", issued on Sep. 4, 2013, p1-p5, in which the listed references were cited.

* cited by examiner

*Primary Examiner* — Kyoung Lee
(74) *Attorney, Agent, or Firm* — Jianq Chyun IP Office

(57) ABSTRACT

A nitride semiconductor substrate and a method for manufacturing the same are provided. The nitride semiconductor substrate includes a base material, a patterned nitride semiconductor, a protection layer, and a nitride semiconductor layer. The patterned nitride semiconductor layer is located on the base material and includes a plurality of nanorod structures and a plurality of block patterns, and an upper surface of the nanorod structures is substantially coplanar with an upper surface of the block patterns. The protection layer covers a side wall of the nanorod structures and a side wall of the block patterns. The nitride semiconductor layer is located on the patterned nitride semiconductor layer, and a plurality of nanopores are located between the nitride semiconductor layer and the patterned nitride semiconductor layer.

23 Claims, 4 Drawing Sheets

NITRIDE SEMICONDUCTOR SUBSTRATE AND METHOD FOR MANUFACTURING THE SAME

CROSS-REFERENCE TO RELATED APPLICATION

This application claims the priority benefit of Taiwan application serial no. 99146145, filed on Dec. 27, 2010. The entirety of the above-mentioned patent application is hereby incorporated by reference herein and made a part of this specification.

TECHNICAL FIELD

The disclosure relates to a nitride semiconductor substrate and a method for manufacturing the same.

BACKGROUND

In recent years, light-emitting diodes (LEDs) have been widely used in various fields. Especially, blue LEDs made of gallium nitride can obtain white light in combination with yellow phosphor, of which not only the performance in brightness is higher than that of a conventional lamp or light bulb, but also the power consumption is lower than that of the conventional lamp or light bulb. In addition, the service life of the LED is longer than that of the conventional lamp or light bulb.

Presently, in manufacturing gallium nitride semiconductor light-emitting devices, due to the difference in the lattice constant between the gallium nitride semiconductor layer and a heterogeneous base material, dislocations easily occurs during the epitaxial growth of the gallium nitride semiconductor layer. Therefore, the luminous efficiency of the gallium nitride semiconductor light-emitting device is influenced.

Conventionally, a laser separation method is adopted to separate the gallium nitride semiconductor layer from the heterogeneous base material, or an etching method is adopted to remove a barrier structure between the gallium nitride semiconductor layer and the heterogeneous base material, so as to separate the gallium nitride semiconductor layer from the heterogeneous base material. In addition, the method of high-temperature etching method is adopted to remove an interface layer between the gallium nitride semiconductor layer and the heterogeneous base material, so as to separate the gallium nitride semiconductor layer from the heterogeneous base material. However, the methods mentioned above cannot solve the problem of poor luminous efficiency of the gallium nitride semiconductor light-emitting devices caused by dislocations during the epitaxial growth of the gallium nitride semiconductor layer.

SUMMARY

A nitride semiconductor substrate is introduced herein. The nitride semiconductor substrate includes a base material, a patterned nitride semiconductor, a protection layer, and a nitride semiconductor layer. The patterned nitride semiconductor layer is located on the base material, and includes a plurality of nanorod structures and a plurality of block patterns, wherein an upper surface of the nanorod structures is substantially coplanar with anupper surface of the block patterns. The protection layer covers a side wall of the nanorod structures and a side wall of the block patterns. The nitride semiconductor layer is located on the patterned nitride semiconductor layer, and a plurality of nanopores are located between the nitride semiconductor layer and the patterned nitride semiconductor layer.

A method for manufacturing a nitride semiconductor substrate is introduced herein. The method includes: forming a nitride semiconductor material on a base material; patterning the nitride semiconductor material to form a plurality of nanorod structures and a plurality of block patterns, wherein an upper surface of the nanorod structures is substantially coplanar with anupper surface of the block patterns; forming a protection layer on a side wall of the nanorod structures and a side wall of the block patterns; and performing a lateral epitaxial growth process to form a nitride semiconductor layer on the patterned nitride semiconductor layer, in which a plurality of nanopores are formed between the nitride semiconductor layer and the patterned nitride semiconductor layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The structure principle and working principle of the disclosure are described in detail below with reference to the accompanying drawings.

Figure 1A:
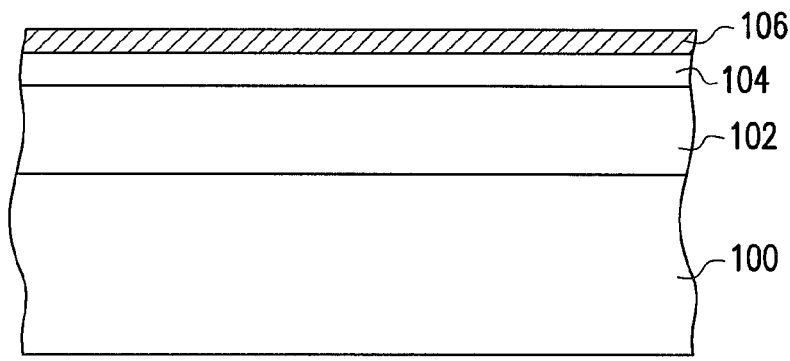
FIG. 1A to FIG. 1H are schematic cross-sectional views of a process for manufacturing a nitride semiconductor substrate according to an embodiment of the disclosure.

FIG. 1A to FIG. 1H are schematic cross-sectional views of a process for manufacturing a nitride semiconductor substrate according to an embodiment of the disclosure. Referring to FIG. 1A, first, a base material 100 is provided. According to this embodiment, the base material 100 is an epitaxial base material, and the base material 100 may include silicon, silicon carbide, sapphire, gallium nitride, aluminium nitride or other epitaxial materials.

Next, a nitride semiconductor material 102 is formed on the base material 100. According to this embodiment, the nitride semiconductor material 102 is formed by a metalorganic chemical vapour deposition (MOCVD) process, and the thickness of the formed nitride semiconductor material 102 is approximately between 0.5 μm and 5 μm, preferably between 1 μm and 5 μm, and more preferably between 2 μm and 3 μm. The nitride semiconductor material 102 includes gallium nitride (GaN), aluminium gallium nitride (AlGaN), aluminium nitride (AlN), indium gallium nitride (InGaN) or a combination thereof. According to an embodiment, the nitride semiconductor material 102 may be gallium nitride (GaN) with a thickness between 2 μm and 3 μm. According to another embodiment, the nitride semiconductor material 102 may be formed by stacking aluminium nitride (AlN) with a thickness between 10 nm and 500 nm, aluminium gallium nitride (AlGaN) with a thickness between 1 μm and 3 μm, and gallium nitride (GaN) with a thickness between 2 μm and 3 μm.

Then, the nitride semiconductor material 102 is patterned. According to this embodiment, the method of patterning the nitride semiconductor material 102 includes steps shown in FIG. 1A to FIG. 1D.

First, a dielectric layer 104 is formed on the nitride semiconductor material 102. According to this embodiment, the dielectric layer 104 is formed through a plasma-enhanced chemical vapour deposition(PECVD), and the thickness of the dielectric layer 104 is between 300 nm and 600 nm. The material of the dielectric layer 104 may be silicon oxide, silicon nitride or silicon oxynitride.

Afterwards, a metal layer 106 is formed on the dielectric layer 104. In this embodiment, the method for forming the metal layer 106 includes an electron beam deposition process, and the thickness of the formed metal layer 106 is between 10 nm and 40 nm. In addition, the metal layer 106 includes nickel (Ni), silver (Ag), gold (Au), copper (Cu) or other suitable metals.

Figure 1B:
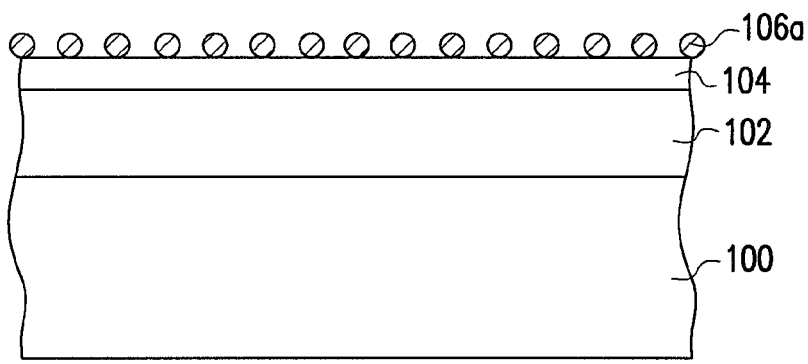

Then, an annealing process is performed, so that the metal layer 106 is converted into a plurality of metal nanograins 106a, as shown in FIG. 1B. According to this embodiment, the annealing process may be a rapid thermal anneal (RTA) process, in which the temperature is between 250° C. and 950° C., and preferably between 550° C. and 950° C., and the duration is between 1 and 2 minutes. In addition, during the RTA process, an inert gas such as argon or nitrogen is further provided. After the annealing process, the metal layer 106 may be converted into metal nanograins 106a with a diameter between 30 nm and 300 nm, and the metal nanograins 106a are randomly or regularly distributed on the dielectric layer 104.

Figure 1C:
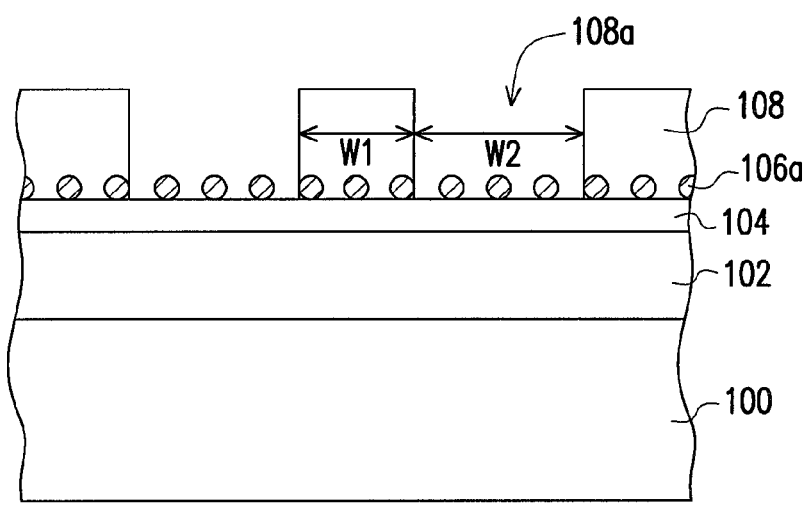

Referring to FIG. 1C, a patterned photoresist layer 108 is formed on the metal nanograins 106a. The patterned photoresist layer 108 is formed by a known lithography process, for example. The patterned photoresist layer 108 has an opening pattern 108a to expose a part of the metal nanograins 106a. According to this embodiment, the width of the patterned photoresist layer 108 is formed to W1, the width of the opening pattern 108a of the patterned photoresist layer 108 is W2, and W1/W2 is approximately between 0.8 and 1.2, and preferably 1. Here, the width W1 of the patterned photoresist layer 108 is, for example, between 2 μm and 5 μm, and the width W2 of the opening pattern 108a of the patterned photoresist layer 108 is, for example, between 2 μm and 5 μm.

Figure 1D:
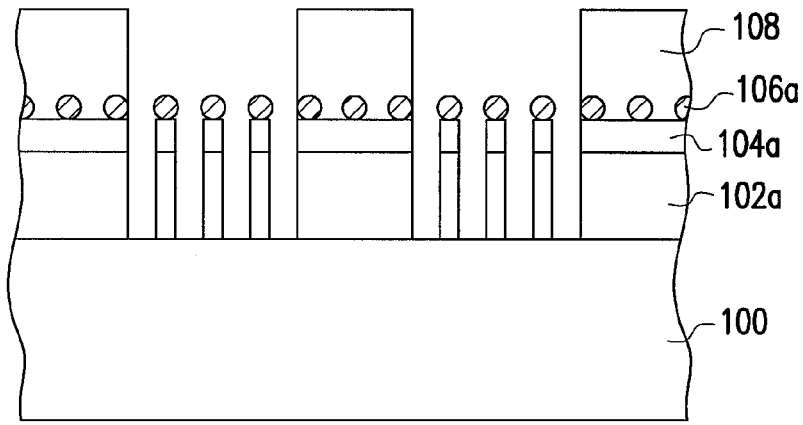

Referring to FIG. 1D, the nitride semiconductor material 102 is patterned with the patterned photoresist layer 108 and the metal nanograins 106a as an etching mask. Specifically, an etching process is performed on the dielectric layer 104 and the nitride semiconductor material 102 with the patterned photoresist layer 108 and the metal nanograins 106a as the etching masks so as to form a patterned dielectric layer 104a and a patterned nitride semiconductor layer 102a.

Figure 1E:
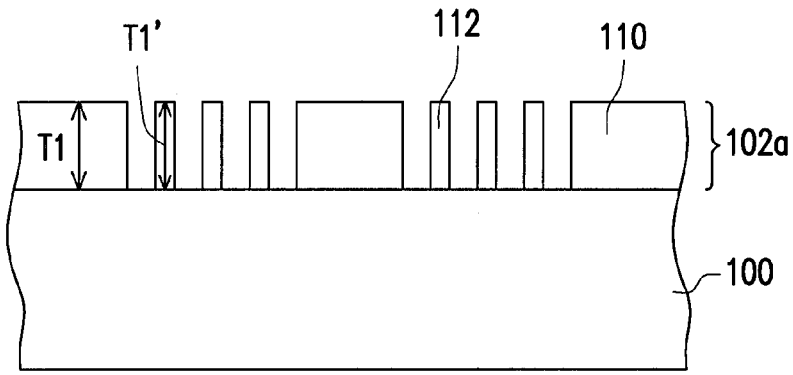

Next, the metal nanograins 106a, the patterned photoresist layer 108, and the patterned dielectric layer 104a are removed, as shown in FIG. 1E, so as to expose the patterned nitride semiconductor layer 102a. The patterned nitride semiconductor layer 102a has nanorod structures 112 and block patterns 110. According to this embodiment, the metal nanograins 106a, the patterned photoresist layer 108, and the patterned dielectric layer 104a are removed through, for example, a wet etching removal process.

It should be noted that, after the removal of the metal nanograins 106a, the patterned photoresist layer 108, and the patterned dielectric layer 104a, the height T1' of the nanorod structures 112 of the patterned nitride semiconductor layer 102a is substantially the same as or similar to the height T1 of the block patterns 110. During the removal of the metal nanograins 106a, the patterned photoresist layer 108, and the patterned dielectric layer 104a, due to process parameters (for example, etching conditions), the height T1' of the nanorod structures 112 of the patterned nitride semiconductor layer 102a is different from the height T1 of the block patterns 110, for example, the height T1' of the nanorod structures 112 is different from the height T1 of the block patterns 110 by about 30% or less. In other words, (T1−T1')/T1≤±30%; or (T1−T1')/T1'≤±30%. However, preferably, the height T1' of the nanorod structures 112 of the patterned nitride semiconductor layer 102a is identical to the height T1 of the block patterns 110.

Figure 1F:
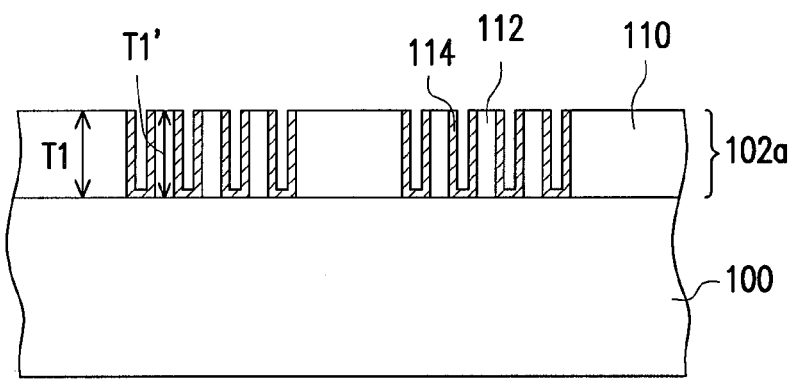

Referring to FIG. 1F, next, a protection layer 114 is formed on a side wall of the nanorod structures 112 and a side wall of the block patterns 110. The method for forming the protection layer 114 includes, for example, first, forming a layer of protection material through plasma-enhanced chemical vapour deposition (PECVD); next, removing the protection layer 114 at the top of the nanorod structures 112 and the top of the block patterns 110, so as to expose the top of the nanorod structures 112 and the top of the block patterns 110. The protection layer 114 at the top of the nanorod structures 112 and the top of the block patterns 110 may be removed through a dry etching process. Here, the protection layer 114 includes silicon dioxide, silicon nitride or silicon oxynitride. In addition, the thickness of the protection layer 114 is, for example, between 100 nm and 400 nm.

Figure 2:
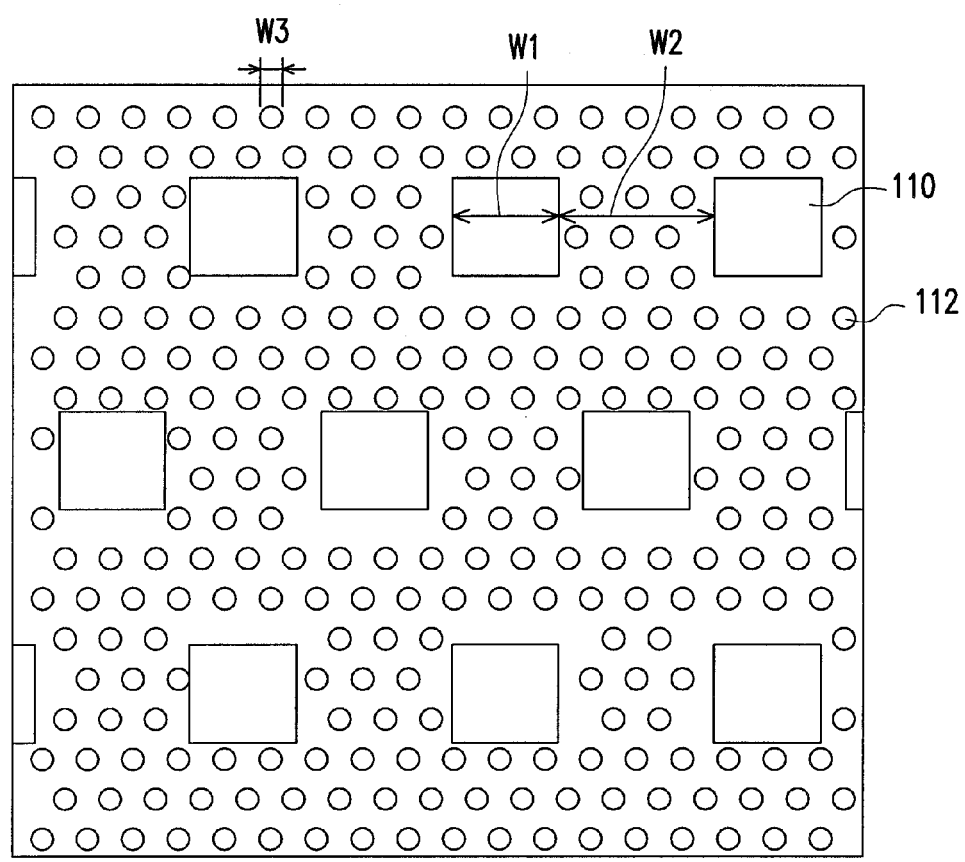
FIG. 2 is a schematic top view of a structure in FIG. 1F.

FIG. 2 is a top view of a structure of FIG. 1F. Referring to FIG. 1F and FIG. 2, the formed block patterns 110 are distributed among the nanorod structures 112. The width of the block patterns 110 is W1, and the spacing of the block patterns 110 is W2. As the block pattern 110 is transferred from the patterned photoresist layer 108 in FIG. 1C, the width W1 and the spacing W2 of the block patterns 110 are equivalent to the width and the opening width of the patterned photoresist layer 108. Therefore, width-to-spacing ratio W1/W2 of the block patterns 110 is approximately between 0.8 and 1.2, and preferably 1. Furthermore, the width W1 of the block patterns 110 is, for example, between 2 μm and 5 μm, and the spacing W2 of the block patterns 110 is, for example, between 2 μm and 5 μm. In addition, as the nanorod structures 112 are transferred from the metal nanograins 106a in FIG. 1C, the width W3 of the nanorod structure 112 is equivalent to the diameter of the metal nanograins 106a, and is approximately between 30 nm and 300 nm. It should be noted that, in FIG. 2, the block pattern 110 is, for example, a square pattern, but the disclosure is not limited thereto. According to other embodiments, the block pattern 110 may also be a circular, rectangular, triangular, cross-shaped pattern or other polygonal patterns.

Figure 1G:
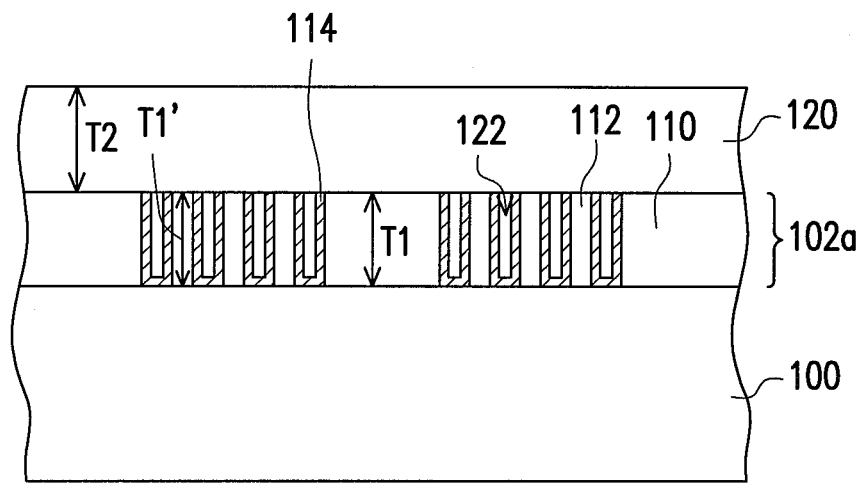

Referring to FIG. 1G, a lateral epitaxial growth process is performed to form a nitride semiconductor layer 120 on the patterned nitride semiconductor layer 102a (the nanorod structures 112 and the block patterns 110), in which a plurality of nanopores 122 are formed between the nitride semiconductor layer 120 and the patterned nitride semiconductor layer 102a. According to this embodiment, the lateral epitaxial growth process is, for example, a hydride vapour phase epitaxy (HVPE) process for coalescence of the nitride semiconductor layer 120 and film thickness growth. The thickness T2 of the nitride semiconductor layer 120 is not greater than 50 μm. According to this embodiment, the material of the nitride semiconductor layer 120 includes gallium nitride (GaN), aluminium gallium nitride (AlGaN), aluminium nitride (AlN), indium gallium nitride (InGaN) or a combination thereof, and preferably is gallium nitride (GaN).

According to this embodiment, after the nitride semiconductor layer 120 is formed, a plurality of nanopores 122 is provided between the nitride semiconductor layer 120 and the patterned nitride semiconductor layer 102a. Here, the protection layer 114 not only covers the side wall of the nanorod structures 112 and the side wall of the block patterns 110, but also covers the bottom of the nanopores 122. However, the disclosure is not limited thereto. According to other embodiments, the protection layer 114 may merely cover the side wall of the nanorod structures 112 and the side wall of the block pattern 110.

Additionally, the height of the nanorod structures 112 and the block patterns 110 is equivalent to the thickness of the patterned nitride semiconductor layer 102a, so the height T1 of the nanorod structures 112 and the block pattern 110 is approximately between 0.5 µm and 5 µm, preferably between 1 µm and 5 µm, and more preferably between 2 µm and 3 µm.

The nitride semiconductor substrate formed according to the above method, as shown in FIG. 1G, includes the base material 100, the patterned nitride semiconductor layer 102a, the protection layer 114, and the nitride semiconductor layer 120. The patterned nitride semiconductor layer 102a is located on the base material 100, in which the patterned nitride semiconductor layer 102a includes the plurality of nanorod structures 112 and the plurality of block patterns 110, and the upper surface of the nanorod structures 112 is substantially coplanar with the upper surface of the block patterns 110. In other words, preferably, the upper surface of the nanorod structures 112 and the upper surface of the block patterns 110 are substantially located in the same horizontal plane, and a bottom surface of the nanorod structures 112 and a bottom surface of the block patterns 110 are substantially located in the same horizontal plane. However, the disclosure is not limited that the upper surface of the nanorod structures 112 must be completely coplanar with the upper surface of the block patterns 110. In other words, the horizontal position of the upper surface of the nanorod structures 112 may be different from the horizontal position of the upper surface of the block patterns 110 by 30% or less, that is, the height T1' of the nanorod structure 112 is different from the height T1 of the block pattern 110 by about 30% or less. In other words, $-30\% \leq (T1-T1')/T1 \leq +30\%$; or $-30\% \leq (T1-T1')/T1' \leq +30\%$.

The protection layer 114 is coated on the side wall of the nanorod structures 112 and the side wall of the block patterns 110. The nitride semiconductor layer 120 is located on the patterned nitride semiconductor layer 102a, in which the plurality of nanopores 122 is provided between the nitride semiconductor layer 120 and the patterned nitride semiconductor layer 102a.

Figure 1H:
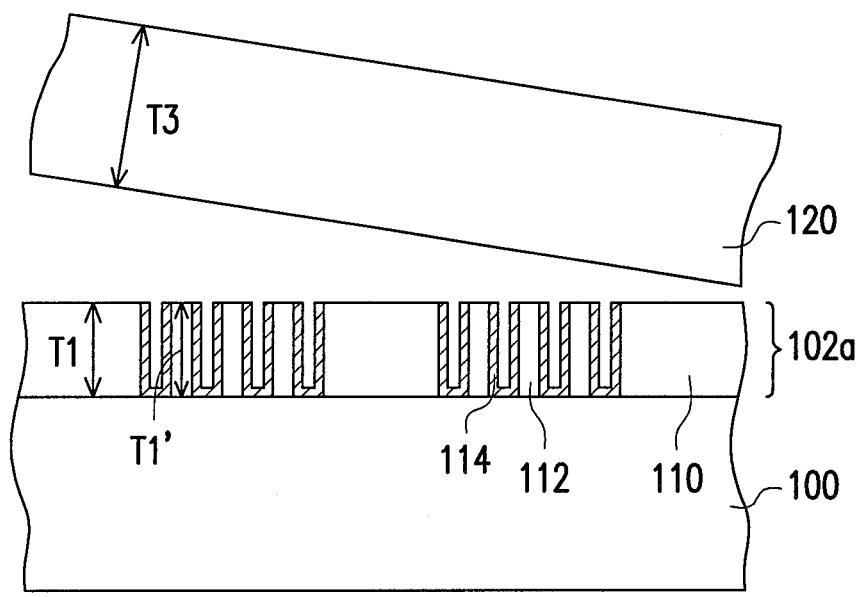

After the nitride semiconductor layer 120 is formed, a separation process may be performed, so that the nitride semiconductor layer 120 is separated from the patterned nitride semiconductor layer 102a, as shown in FIG. 1H. According to this embodiment, the separation process includes continuously performing the lateral epitaxial growth process in FIG. 1G, so that the thickness T3 of the nitride semiconductor layer 120 is greater than 50 µm, preferably greater than 100 µm. Then, a cooling process is performed, in which due to the difference of thermal expansion coefficients between the nitride semiconductor layer 120 and the base material 100, the nitride semiconductor layer 120 is self-separated from the patterned nitride semiconductor layer 102a. The cooling process may be, for example, moving the above structure out of a vapour phase epitaxial growth chamber for automatic cooling to the room temperature. The separated nitride semiconductor layer 120 may be applied to manufacturing of the semiconductor light-emitting devices.

EXAMPLES

A patterned nitride semiconductor layer (for example, the structure shown in FIG. 2 and FIG. 1F) of a nitride semiconductor substrate according to this example includes a plurality of nanorod structures 112 and a plurality of block patterns 110, in which the width of the nanorod structures 112 is approximately 120 nm, and the width of the block patterns 110 is approximately 2800 nm. In this example, after a nitride semiconductor layer is formed on the patterned nitride semiconductor layer through a lateral epitaxial growth process, the formed nitride semiconductor layer has been coalesced.

Based on the above, in the disclosure, a patterned nitride semiconductor layer with a plurality of nanorod structures and a plurality of block patterns is formed on a base material, and then a nitride semiconductor layer is formed on the patterned nitride semiconductor layer through a lateral epitaxial growth process. As the nitride semiconductor layer is formed by growing to be coalesced on the nanorod structures and the block patterns through a lateral epitaxial process, the dislocation density of the nitride semiconductor layer during the epitaxial growth can be reduced, and stresses caused by lattice mismatching can be released, thereby improving the quality of the nitride semiconductor layer. In other words, when the nitride semiconductor layer is applied to manufacturing of light-emitting devices, the luminous efficiency of the light-emitting devices can be improved.

Additionally, in the disclosure, a nitride semiconductor layer is formed on a patterned nitride semiconductor layer (nanorod structures and block patterns), so that a plurality of nanopores is provided between the patterned nitride semiconductor layer and the nitride semiconductor layer. When the thickness of a growth film of the nitride semiconductor layer is higher than 50 µm, due to the difference of thermal expansion coefficients between the nitride semiconductor layer and the base material, the nitride semiconductor layer can be self-separated from the base material through a cooling process. In other words, in the disclosure, the nitride semiconductor layer is separated from the base material without using the conventional laser separation method or etching separation method. Therefore, the resulting nitride semiconductor layer is not subject to damages caused by laser or etching processing, so the nitride semiconductor layer manufactured in the disclosure has a higher quality compared with the conventional gallium nitride substrate. When the nitride semiconductor layer is applied to manufacturing of the light-emitting devices, the luminous efficiency of the light-emitting devices can be improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. A nitride semiconductor substrate, comprising:
a base material;
a patterned nitride semiconductor layer, located on the base material, wherein the patterned nitride semiconductor layer comprises a plurality of nanorod structures and a plurality of block patterns, wherein an upper surface of the nanorod structures is substantially coplanar with an upper surface of the block patterns;
a protection layer, covering a side wall of the nanorod structures and a side wall of the block patterns; and a nitride semiconductor layer, located on the patterned nitride semiconductor layer, wherein a plurality of nanopores are located between the nitride semiconductor layer and the patterned nitride semiconductor layer.

2. The nitride semiconductor substrate according to claim 1, wherein the block patterns are distributed among the nanorod structures.

3. The nitride semiconductor substrate according to claim 1, wherein a width-to-spacing ratio of the block patterns is between 0.8 and 1.2.

4. The nitride semiconductor substrate according to claim 1, wherein a width of the nanorod structures is between 30 nm and 300 nm.

5. The nitride semiconductor substrate according to claim 1, wherein a thickness of the nitride semiconductor layer is less than or equal to 50 μm.

6. The nitride semiconductor substrate according to claim 1, wherein a height of the nanorod structures and the block patterns is between 0.5 μm and 5 μm.

7. The nitride semiconductor substrate according to claim 1, wherein the protection layer also covers a bottom of the nanopores.

8. The nitride semiconductor substrate according to claim 1, wherein the nitride semiconductor layer comprises gallium nitride (GaN), aluminium gallium nitride (AlGaN), aluminium nitride (AlN), indium gallium nitride (InGaN) or a combination thereof.

9. The nitride semiconductor substrate according to claim 1, wherein the patterned nitride semiconductor layer comprises gallium nitride (GaN), aluminium gallium nitride (AlGaN), aluminium nitride (AlN), indium gallium nitride (InGaN) or a combination thereof.

10. The nitride semiconductor substrate according to claim 1, wherein the protection layer comprises silicon dioxide, silicon nitride or silicon oxynitride.

11. The nitride semiconductor substrate according to claim 1, wherein the base material is an epitaxial base material, and the base material comprises silicon, silicon carbide, aluminium oxide, sapphire, gallium nitride or aluminium nitride.

12. The nitride semiconductor substrate according to claim 1, wherein the nitride semiconductor layer are supported by the block patterns and the nanorod structures, and the block patterns and the nanorods are disposed between the nitride semiconductor layer and the base material.

13. The nitride semiconductor substrate according to claim 1, wherein the height T1' of the nanorod structure and the height T1 of the block pattern satisfy:
 −30%≤(T1−T1')/T1≤+30%; or
 −30%≤(T1−T1')/T1'≤+30%.

14. A method for manufacturing a nitride semiconductor substrate, comprising:
 forming a nitride semiconductor material on a base material;
 patterning the nitride semiconductor material to form a plurality of nanorod structures and a plurality of block patterns, wherein an upper surface of the nanorod structures is substantially coplanar with an upper surface of the block patterns;
 forming a protection layer on a side wall of the nanorod structures and a side wall of the block patterns; and
 performing a lateral epitaxial growth process to form a nitride semiconductor layer on the patterned nitride semiconductor layer, wherein a plurality of nanopores are formed between the nitride semiconductor layer and the patterned nitride semiconductor layer.

15. The method for manufacturing a nitride semiconductor substrate according to claim 14, wherein the method for forming the nanorod structures and the block patterns comprises:
 forming a dielectric layer on the nitride semiconductor material;
 forming a metal layer on the dielectric layer;
 performing an annealing process, so that the metal layer is converted into a plurality of metal nanograins;
 forming a patterned photoresist layer on the metal nanograins;
 patterning the nitride semiconductor material with the patterned photoresist layer and the metal nanograins as an etching mask so as to form the nanorods and the block patterns; and
 removing the metal nanograins, the patterned photoresist layer, and the dielectric layer.

16. The method for manufacturing a nitride semiconductor substrate according to claim 15, wherein the metal layer comprises nickel (Ni), silver (Ag), gold (Au) or copper (Cu).

17. The method for manufacturing a nitride semiconductor substrate according to claim 15, wherein the annealing process is a rapid thermal annealing (RTA) process, the temperature is between 250° C. and 950° C., and the duration is between 1 min and 2 min.

18. The method for manufacturing a nitride semiconductor substrate according to claim 15, wherein the method for forming the metal layer comprises an electron beam deposition process, and a thickness of the metal layer is between 10 nm and 40 nm.

19. The method for manufacturing a nitride semiconductor substrate according to claim 15, wherein a thickness of the dielectric layer is between 300 nm and 600 nm.

20. The method for manufacturing a nitride semiconductor substrate according to claim 14, wherein the nitride semiconductor material is formed by a metalorganic chemical vapour deposition (MOCVD) process, and a thickness of the nitride semiconductor material is between 0.5 μm and 5 μm.

21. The method for manufacturing a nitride semiconductor substrate according to claim 14, wherein a thickness of the protection layer is between 100 nm and 400 nm.

22. The method for manufacturing a nitride semiconductor substrate according to claim 14, after forming the nitride semiconductor layer, further comprising a separation process, so that the nitride semiconductor layer is separated from the patterned nitride semiconductor layer.

23. The method for manufacturing a nitride semiconductor substrate according to claim 22, wherein the separation process comprises:
 continuously performing the lateral epitaxial growth process, so that a thickness of the nitride semiconductor layer is greater than 50 μm; and
 performing a cooling process, so that the nitride semiconductor layer is self-separated from the patterned nitride semiconductor layer.

* * * * *